(12) United States Patent
Wei et al.

(10) Patent No.: US 11,456,399 B2
(45) Date of Patent: Sep. 27, 2022

(54) LIGHT EMITTING DIODE (LED) CHIP AND MANUFACTURING METHOD AND LIGHT EMITTING METHOD THEREOF

(71) Applicant: XIAMEN CHANGELIGHT CO., LTD., Fujian (CN)

(72) Inventors: Zhendong Wei, Xiamen (CN); Junxian Li, Xiamen (CN); Qilong Wu, Xiamen (CN); Yingce Liu, Xiamen (CN); Hongyi Zhou, Xiamen (CN)

(73) Assignee: Xiamen Changelight Co., Ltd., Fujian (CN)

( * ) Notice: Subject to any disclaimer, the term of this patent is extended or adjusted under 35 U.S.C. 154(b) by 191 days.

(21) Appl. No.: 16/624,930

(22) PCT Filed: Jul. 30, 2018

(86) PCT No.: PCT/CN2018/097727
§ 371 (c)(1),
(2) Date: Dec. 20, 2019

(87) PCT Pub. No.: WO2019/218484
PCT Pub. Date: Nov. 21, 2019

(65) Prior Publication Data
US 2020/0176635 A1    Jun. 4, 2020

(30) Foreign Application Priority Data

May 18, 2018 (CN) .......................... 201810478979.1
May 18, 2018 (CN) .......................... 201820743497.X

(51) Int. Cl.
H01L 33/38    (2010.01)
H01L 33/00    (2010.01)
H01L 33/44    (2010.01)

(52) U.S. Cl.
CPC .......... H01L 33/38 (2013.01); H01L 33/0095 (2013.01); H01L 33/44 (2013.01); *H01L 2933/0016* (2013.01); *H01L 2933/0025* (2013.01)

(58) Field of Classification Search
CPC ..... H01L 33/38; H01L 33/0095; H01L 33/44; H01L 2933/0016; H01L 2933/0025; H01L 33/62; H01L 33/382; H01L 33/42
See application file for complete search history.

(56) References Cited

U.S. PATENT DOCUMENTS

2013/0049053 A1* 2/2013 Kususe ................ H01L 33/405
                                                                257/98
2013/0134867 A1* 5/2013 Yang ...................... H01L 33/08
                                                                313/499

* cited by examiner

*Primary Examiner* — Su C Kim
(74) *Attorney, Agent, or Firm* — Arch & Lake LLP

(57) ABSTRACT

A LED chip includes a substrate, an N-type semiconductor layer, an active region, a P-type semiconductor layer, a transparent electric conductive layer, and a passivation protective layer stacked with each other in sequence. The passivation protective layer has a plurality holes corresponding to different positions of the transparent electric conductive layer respectively. A P-type electrode is electrically linked with the transparent electric conductive layer through said plurality of holes, while an N-type electrode is electrically linked with said N-type semiconductor layer.

4 Claims, 10 Drawing Sheets

LIGHT EMITTING DIODE (LED) CHIP AND MANUFACTURING METHOD AND LIGHT EMITTING METHOD THEREOF

CROSS REFERENCE OF RELATED APPLICATION

This is a U.S. National Stage under 35 U.S.C. 371 of the International Application Number PCT/CN2018/097727, filed Jul. 30, 2018, which claims priority to Chinese application number CN201810478979.1, filed May 18, 2018 and Chinese application number CN201820743497.X, filed May 18, 2018, which are incorporated herewith by references in their entities.

BACKGROUND OF THE PRESENT INVENTION

Field of Invention

The present invention relates to a LED chip, and more particularly to a light emitting diode (LED) and its LED chip, and the manufacturing method and light-emitting method of the LED chip.

Description of Related Arts

LED, Light-Emitting Diode, is regarded as a new generation of lighting tools due to its advantages of high lightness, longer life span, small size, low power-consumption, and so on. However, the conventional LED still has low luminous efficiency, so that how to improve the luminous efficiency of the LED chip while solving a series of problems generated for improving the luminous efficiency of the LED chip has become one of the most important research topics.

Referring to the FIG. 1 to FIG. 7 of the drawings, the conventional LED chip is illustrated, wherein the LED chip comprises a substrate 10P, an epitaxial stacked layer 20P, a current blocking layer 30P, a transparent electrical conductive layer 40P, a metallic electrode assembly 50P, and a passivation protective layer 60P. The conventional LED chip also has an N-type exposed portion 70P. Accordingly, the epitaxial stacked layer 20P further comprises an N-type semiconductor layer 21P, an active region 22P and a P-type semiconductor layer 23P, wherein the N-type semiconductor layer 21P, the active region 22P and the P-type semiconductor layer 23P are formed sequentially from the substrate 10P, such that the substrate 10P and the N-type semiconductor layer 21P, the active region 22P and the P-type semiconductor layer 23P of the epitaxial stacked layer 20P are stacked in sequence.

A manufacturing process for the conventional LED chip is described as follows:

(a) Referring to the FIGS. 3A and 3B of the drawings, a first photoresist layer is formed on the P-type semiconductor layer 23P of the epitaxial stacked layer 20P, and then the N-type exposed portion 70P is formed by dry-etching the epitaxial stacked layer 20P, wherein the N-type exposed portion 70P is extended from the P-type semiconductor layer 23P to the N-type semiconductor layer 21P through the active region 22P, such that a portion of the N-type semiconductor layer 21P is exposed to the epitaxial. Then, the first photoresist layer is removed from the epitaxial stacked layer 20P.

(b) Referring to FIG. 4A and FIG. 4B of the drawings, a second photoresist layer is formed on the P-type semiconductor layer 23P of the epitaxial stacked layer 20P, and then the current blocking layer 30P is formed on the epitaxial stacked layer 20P by wet-etching the epitaxial stacked layer 20P, wherein the current blocking layer 30P is stacked on the P-type semiconductor layer 23P of the epitaxial stacked layer 20P, and then the second photoresist layer is removed from the P-type semiconductor layer 23P of the epitaxial stacked layer 20P.

(c) Referring to FIGS. 5A and 5B of the drawings, the transparent electric conductive layer 40P, which is stacked on the P-type semiconductor layer 23P of the epitaxial stacked layer 20P and encapsulates the current blocking layer 30P, is formed, wherein a third photoresist layer is formed on the transparent electric conductive layer 40P sequentially. A portion of the transparent electric conductive layer 40P is removed by etching, so as to expose a respective portion of the current blocking layer 30P, and then the third photoresist layer is removed from the transparent electric conductive layer 40P.

(d) Referring to FIG. 6A and FIG. 6B of the drawings, a fourth photoresist layer is formed on the transparent electric conductive layer 40P, and an N-type electrode 52P and a P-type electrode 51P of the metallic electrode assembly 50P are formed on the transparent electric conductive layer 40P, wherein the P-type electrode 51P is electrically linked with the transparent electric conductive layer 40P, while the N-type electrode 52P is electrically linked with the N-type semiconductor layer 21P. Then, the forth photoresist layer is removed from the transparent electric conductive layer 40P.

(e) Referring to FIG. 7A and FIG. 7B of the drawings, the passivation protective layer 60P is formed on the N-type electrode 51P and P-type electrode 52P, wherein a fifth photoresist layer is formed on the passivation protective layer 60P sequentially, and then the passivation protective layer 60P is etched for allowing a portion of the P-type electrode 51P and a portion of the N-type electrode 52P being exposed. Then, the fifth photoresist layer is removed from the passivation protective layer 60P to form the LED chip eventually.

However, there are still many drawbacks existing in the conventional LED chip. Firstly, since the current blocking layer 30P is stackingly formed on the P-type semiconductor layer 23P of the epitaxial stacked layer 20, the amount of the material for manufacturing the chip is increased as well as the size thereof and the productivity of the chip is affected due to a prolonged manufacturing process, so that the manufacturing costs of the LED chip is increased.

Furthermore, the adhesion between the P-type electrode 51P and the transparent electric conductive layer 40P is relatively week, and that the P-type electrode 51P is not completely contacted with the transparent electric conductive layer 40P, so that a hole design is required for the P-type electrode 51P and the transparent electric conductive layer 40P, resulting in further increase of the manufacturing cost of the chip.

In addition, the P-type electrode 51P is isolated with the transparent electric conductive layer 40P via the current blocking layer 30P, so that less current is able to flow into the peripheral edge of the chip, resulting in a week illumination at the peripheral edge of the chip. Therefore, the luminous efficiency of the chip is adversely influenced.

SUMMARY OF THE PRESENT INVENTION

The invention is advantageous in that it provides a LED and its LED chip, and the manufacturing method and light emitting method of the LED chip, wherein the luminous efficiency of the LED chip is able to be improved significantly.

Another advantage of the invention is to provide a LED and a LED chip thereof, and the manufacturing method and light emitting method of the LED chip, wherein the current in the LED chip is able to be distributed evenly so as to improve the reliability of the LED chip.

Another advantage of the invention is to provide a LED and a LED chip thereof, and the manufacturing method and light emitting method of the LED chip, wherein the manufacture procedure of the photoetching is able to be reduced, which helps to improve the productivity of the LED chip and reduce the manufacturing cost of the LED chip.

Another advantage of the invention is to provide a LED and a LED chip thereof, and the manufacturing method and light emitting method of the LED chip, wherein a first photoetching is taken after stacking a transparent electric conductive base layer on an epitaxial stacked layer, so as to form and stack the transparent electric conductive base layer on a transparent electric conductive layer of the epitaxial stacked layer, which enables the transparent electric conductive layer to be formed and to expose a N-type semiconductor layer of the epitaxial stacked layer in the same manufacture procedure of the first photoetching, such that the LED chip of the present invention has a lower manufacturing cost than the manufacture procedure of the photoetching of the conventional LED chip.

Another advantage of the invention is to provide a LED and a LED chip thereof, and the manufacturing method and light-emitting method of the LED chip, wherein the LED chip provides a passivation protective layer stacked on the transparent electric conductive layer, wherein the passivation protective layer can not only block the current but also improve the effect of the current expanding transversely so as to distribute the current more evenly and to help on improving the luminous efficiency of the LED chip.

Another advantage of the invention is to provide a LED and a LED chip thereof, and the manufacturing method and light-emitting method of the LED chip, wherein the electrode assembly is fabricated after forming the passivation protective layer, such that the passivation protective layer has the effect of blocking the current since the passivation protective layer is directly stacked on the transparent electric conductive layer, and the chip of the present invention needs no special current blocking layer compared to the conventional LED chip, wherein the method described above can not only help to reduce the manufacturing cost of the chip but also help to reduce at least one step of the manufacture procedure of the photoetching of the LED chip and shorten the production line thereof, so as to reduce the manufacturing cost of the LED chip and reduce the size and the thickness of the LED chip.

Another advantage of the invention is to provide a LED and a LED chip thereof, and the manufacturing method and light-emitting method of the LED chip, wherein the passivation protective layer provides an array of passive-layer holes so as to allow the electrode assembly to electrically link with the transparent electric conductive layer, and then the LED chips are able to achieve the dot glowing in the passive-layer holes of the passivation protective layer, such that the brightness of the LED chips is enhanced.

Another advantage of the invention is to provide a LED and a LED chip thereof, and the manufacturing method and light-emitting method of the LED chip, wherein the P-type electrode of the chip comprises an array of finger members formed in the passive-layer holes of the passivation protective layer when the passivation protective layer is formed, so that when the working voltage is applied to the P-type electrode, the current flowing through the finger members of the P-type electrode is able to be provided to the transparent electric conductive layer at different positions of the transparent electric conductive layer to facilitate the current distribution more evenly.

Additional advantages and features of the invention will become apparent from the description which follows, and may be realized by means of the instrumentalities and combinations particular point out in the appended claims.

According to the present invention, the foregoing and other objects and advantages are attained by a LED chip, comprising:

a substrate;

an epitaxial stacked layer which comprises an N-type semiconductor layer, an active region and a P-type semiconductor layer, wherein the N-type semiconductor layer, the active region and the P-type semiconductor layer are stacked with each other in sequence;

a transparent electric conductive layer stacked on the P-type semiconductor layer of the epitaxial stacked layer;

a passivation protective layer having a plurality of passive-layer holes formed therein, wherein the passivation protective layer is stacked on the transparent electric conductive layer in such a manner that the passive-layer holes are positioned with respect to different positions of the transparent electric conductive layer respectively; and an electrode assembly comprising an N-type electrode and a P-type electrode, wherein the N-type electrode is electrically linked with the N-type semiconductor layer of the epitaxial stacked layer, and a portion of the P-type electrode, passing through the plurality of passive-layer holes of the passivation protective layer, is electrically linked with the transparent electric conductive layer.

In one embodiment of the present invention, the LED chip has an N-type exposed portion extending from the passivation protective layer to the N-type semiconductor layer of the epitaxial stacked layer through the transparent electric conductive layer and the P-type semiconductor layer of the epitaxial stacked layer and the active region, such that a portion of the N-type semiconductor layer is exposed at the N-type exposed portion.

In one embodiment of the present invention, the N-type electrode is formed on the N-type semiconductor layer of the epitaxial stacked layer in such a manner that the N-type electrode of the electrode assembly is electrically connected with the N-type semiconductor layer.

In one embodiment of the present invention, the N-type electrode is formed on the P-type semiconductor layer of the epitaxial stacked layer in such a manner that the P-type electrode of the electrode assembly is electrically connected with the P-type semiconductor layer.

In one embodiment of the present invention, the P-type electrode has a plurality of finger members formed in the plurality of passive-layer holes of the passivation protective layer respectively, such that the plurality of finger members of the P-type electrode are electrically connected with the transparent electric conductive layer respectively at different positions of the transparent electric conductive layer.

In one embodiment of the present invention, the plurality of finger members of the P-type electrode comprises a first group of finger members and a second group of finger members, wherein the first and second group of the finger members are extended across the LED chip along a peripheral edge of the LED chip from a first end portion to a second end portion.

In one embodiment of the present invention, the plurality of finger members of the P-type electrode comprises a first group of finger members, a second group of finger members and a third group of finger members, wherein the first group and second group of finger members are extended across the LED chip along a peripheral edge of the LED chip from a first end portion to a second end portion thereof, while the third group of finger members is retained at the second end portion of the LED chip.

In one embodiment of the present invention, the passivation protective layer is stacked on the N-type semiconductor layer that the plurality of passive-layer holes are arranged corresponding to different positions of the N-type semiconductor layer respectively, wherein a portion of the N-type electrode is electrically linked to the N-type semiconductor layer after passing through the passive-layer holes of the passivation protective layer.

In one embodiments of the present invention, the substrate is selected from the group consisting of a sapphire substrate, a silicon substrate and silicon-carbide substrate.

In one embodiment of the present invention, the substrate is selected from the group consisting of a sapphire substrate, a silicon substrate and a silicon-carbide substrate.

According to another aspect of the present invention, the present invention further provides a LED, which comprises:
an encapsulated body,
an electrode pin assembly, wherein the electrode pin assembly comprises an N-type electrode pin and a P-type electrode pin; and
a LED chip, which comprises:
a substrate;
an epitaxial stacked layer which comprises an N-type semiconductor layer, an active region and a P-type semiconductor layer, wherein the N-type semiconductor layer, the active region and the P-type semiconductor layer are stacked with each other in sequence;
a transparent electric conductive layer stacked on the P-type semiconductor layer of the epitaxial stacked layer;
a passivation protective layer having a plurality of passive-layer holes, wherein the passivation protective layer is stacked on the transparent electric conductive layer in such a manner that the passive-layer holes are positioned with respect to different positions of the transparent electric conductive layer respectively; and
an electrode assembly, which comprises an N-type electrode and a P-type electrode, wherein the N-type electrode is electrically linked with the N-type semiconductor layer of the epitaxial stacked layer, and a portion of the P-type electrode, passing through the plurality of passive-layer holes of the passivation protective layer, is electrically linked with the transparent electric conductive layer;
wherein the LED chip is encapsulated in a package body, wherein the N-type electrode pin and the P-type electrode pin are electrically connected with the N-type electrode and the P-type electrode respectively, wherein the N-type electrode pin and the P-type electrode pin are extended from the interior of the package body to the exterior thereof.

In one embodiment of the present invention, the P-type electrode pin gradually reduces its size from a connecting end to a free end thereof.

According to another aspect of the present invention, it further provides a manufacturing method of a LED chip, which comprises the following step.

(a) Form an N-type semiconductor layer, an active region and a P-type semiconductor layer sequentially on a substrate.

(b) Form a transparent electric conductive layer stacked on the P-type semiconductor layer and forming an N-type hole extended from the transparent electric conductive layer to the N-type semiconductor layer through the P-type semiconductor layer and the active region at the same time.

(c) Stack a passivation protective layer having a plurality of passive-layer holes in the transparent electric conductive layer, such that the passive-layer holes of the passivation protective layer are corresponding to different positions of the transparent electric conductive layer respectively.

(d) Electrically connect an N-type electrode to the N-type semiconductor layer, and electrically connect a P-type electrode to the P-type semiconductor layer through the plurality of passive-layer holes of the passivation protective layer.

In one embodiment of the present invention, wherein the step (b) further comprises the steps of:
stacking a transparent electric conductive base layer on the P-type semiconductor layer;
stacking a first photoresist layer on the transparent electric conductive base layer; and
etching the first photoresist layer, the transparent electric conductive base layer, and the active region from pre-determined positions so as to form the N-type hole and the transparent electric conductive layer simultaneously.

In one embodiment of the present invention, wherein the step (b) further comprises the steps of:
stacking a transparent electric conductive base layer on the P-type semiconductor layer;
stacking a first photoresist layer on the transparent electric conductive base layer; and
etching the first photoresist layer, the transparent electric conductive base layer, the active region and a pre-determined position of the N-type semiconductor layer so as to form the N-type hole and the transparent electric conductive layer simultaneously.

In one embodiment of the present invention, the transparent electric conductive layer is stacked on the P-type semiconductor layer by means of evaporation.

In one embodiment of the present invention, in the step (c), a N-type exposed portion, which is extended from the passivation protective layer to the N-type semiconductor layer through the transparent electric conductive layer, P-type semiconductor layer and the active region, is formed at the position of N-type hole, while stacking the passivation protective layer on the transparent electric conductive layer.

In one embodiment of the present invention, the step (c) further comprises the steps of:
stacking a passive base layer on the transparent electric conductive layer;
stacking a second photoresist layer on the passive base layer; and
removing the second photoresist layer and the passive base layer of the positions corresponding to the N-type holes, such that the passivation protective layer and the N-type exposed portion are formed simultaneously.

In one embodiment of the present invention, in the step (d), a plurality of finger members, extending from one side of the passivation protective layer to the opposing side thereof through the plurality passive-layer holes of the passivation protective layer respectively, are formed when the P-type electrode is formed on the passivation protective layer, wherein the finger members are electrically connected with the transparent electric conductive layer respectively at different position of the transparent electric conductive layer respectively.

According to another aspect of the present invention, the present invention further comprises a light emitting method of a LED chip, which comprises the following steps:

(A) Apply an electric current to a transparent electric conductive layer at different positions, such that the electrical current is evenly distributed at the transparent electric conductive layer.

(B) Apply a voltage at two sides of the active region from a N-type semiconductor layer and a P-type semiconductor layer, such that the active region is enabled to produce lighting, wherein the transparent electric conductive layer is stacked on the P-type semiconductor layer.

In one embodiment of the present invention, the electric current is applied to the transparent electric conductive layer from two sides of the LED chip, such that the electrical current is evenly distributed at the transparent electric conductive layer.

In one embodiment of the present invention, the electric current is applied to the transparent electric conductive layer from two sides and one end portion of the LED chip, such that the electrical current is evenly distributed at the transparent electric conductive layer.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

Figure 1:
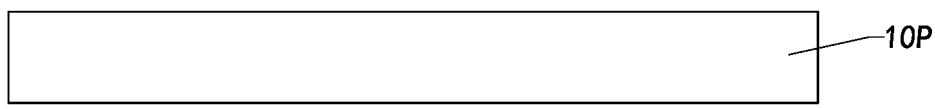
FIG. 1 is a schematic view illustrating a cross-section view of a substrate of a conventional LED chip.
Figure 2:
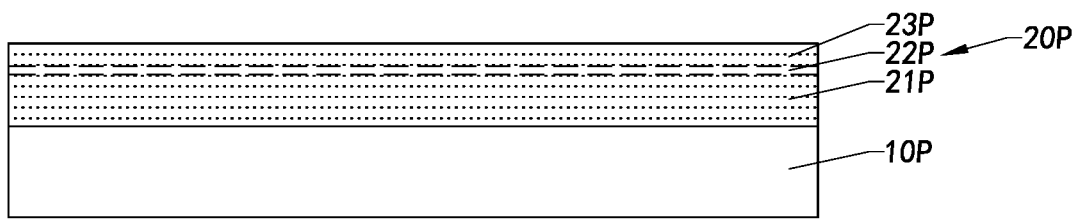
FIG. 2 is a schematic view of a step one of a manufacturing process of the conventional LED chip, illustrating a cross-section view thereof after forming an epitaxial stacked layer on the substrate.
Figure 3A:
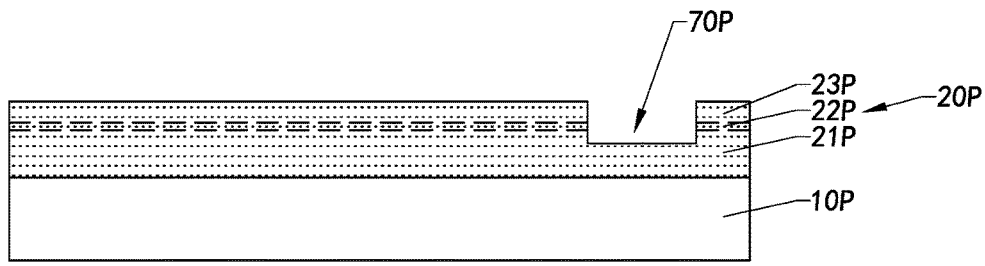
FIG. 3A is a schematic view of a step two of the manufacturing process of the conventional LED chip, illustrating a cross-section view thereof after forming an N-type exposed portion on the epitaxial stacked layer.
Figure 3B:
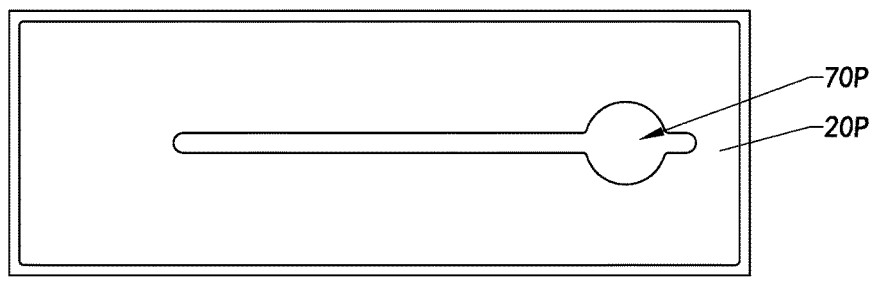
FIG. 3B is a schematic view of the step two of the manufacturing process of the conventional LED chip, illustrating a top view thereof after forming the N-type exposed portion on the epitaxial stacked layer.
Figure 4A:
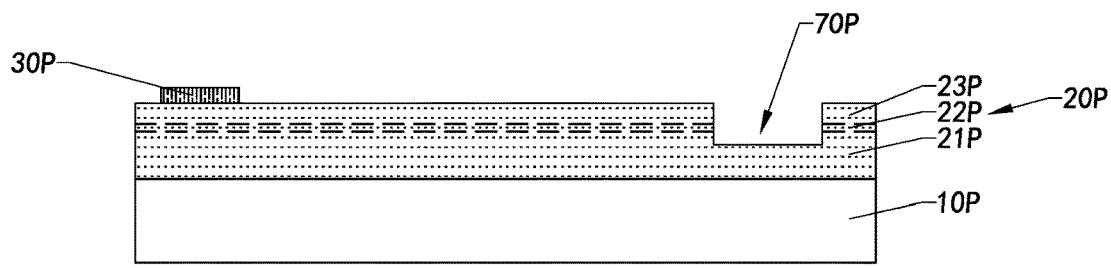
FIG. 4A is a schematic view of a step three of the manufacturing process of the conventional LED chip, illustrating a cross-section view of forming a current blocking layer on the epitaxial stacked layer.
Figure 4B:
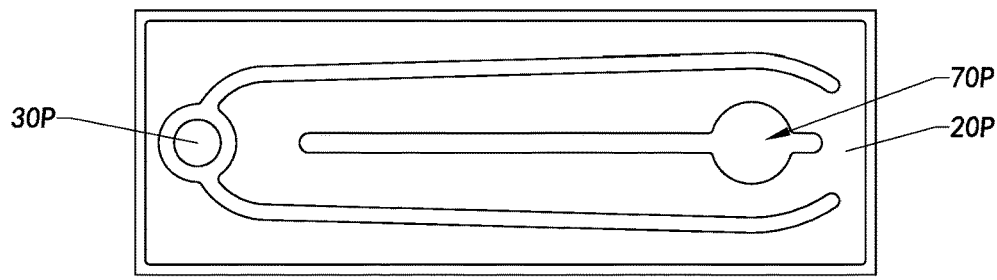
FIG. 4B is a schematic view of the step three of the manufacturing process of the conventional LED chip, illustrating a top view of forming the current blocking layer on the epitaxial stacked layer.
Figure 5A:
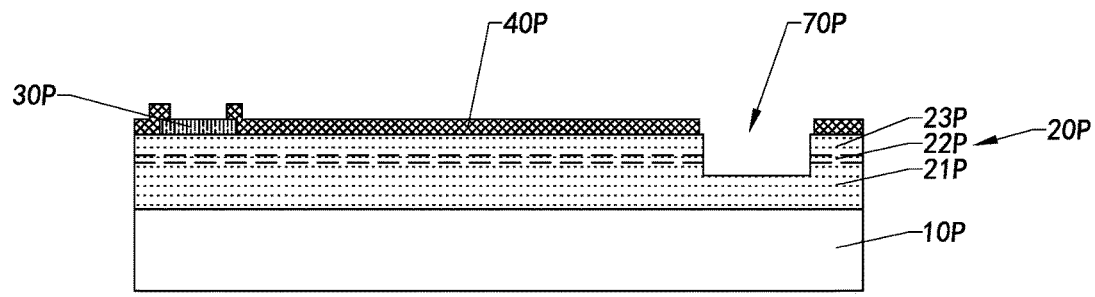
FIG. 5A is a schematic view of a step four of the manufacturing process of the conventional LED chip, illustrating a cross-section view of forming a transparent electric conductive layer on the epitaxial stacked layer.
Figure 5B:
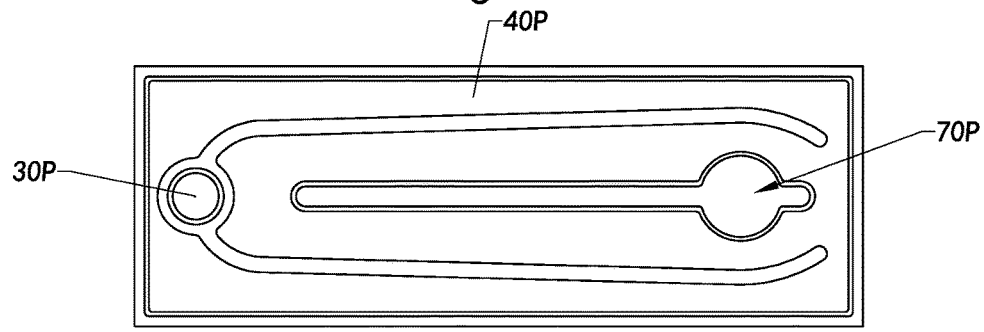
FIG. 5B is a schematic view of the step four of the manufacturing process of the conventional LED chip, illustrating a top view of forming the transparent electric conductive layer on the epitaxial stacked layer of the manufacturing process.
Figure 6A:
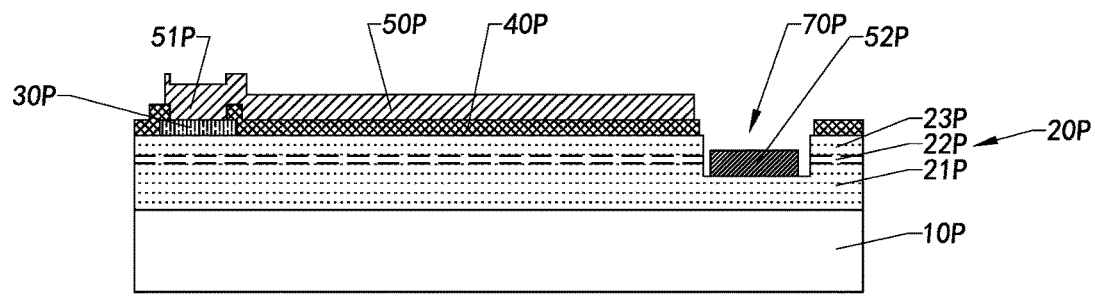
FIG. 6A is a schematic view of a step five of the manufacturing process of the conventional LED chip, illustrating a cross-section view of forming a P-type electrode on the transparent electric conductive layer and forming an N-type electrode on the epitaxial stacked layer.
Figure 6B:
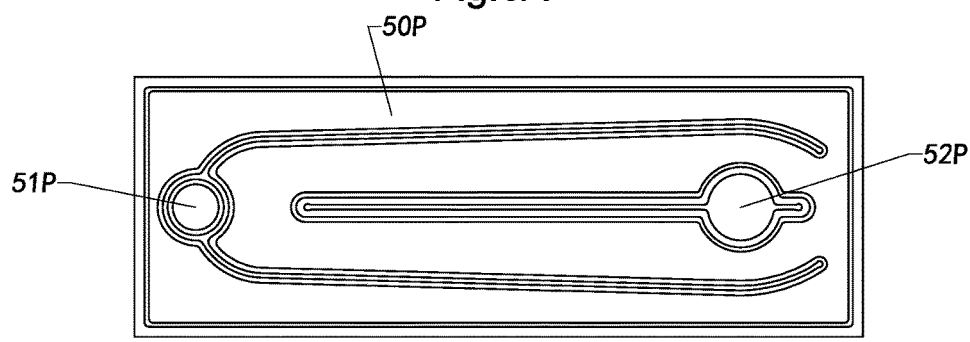
FIG. 6B is a schematic view of the step five of the manufacturing process of the conventional LED chip, illustrating a top view of forming the P-type electrode on the transparent electric conductive layer and forming the N-type electrode on the epitaxial stacked layer.
Figure 7A:
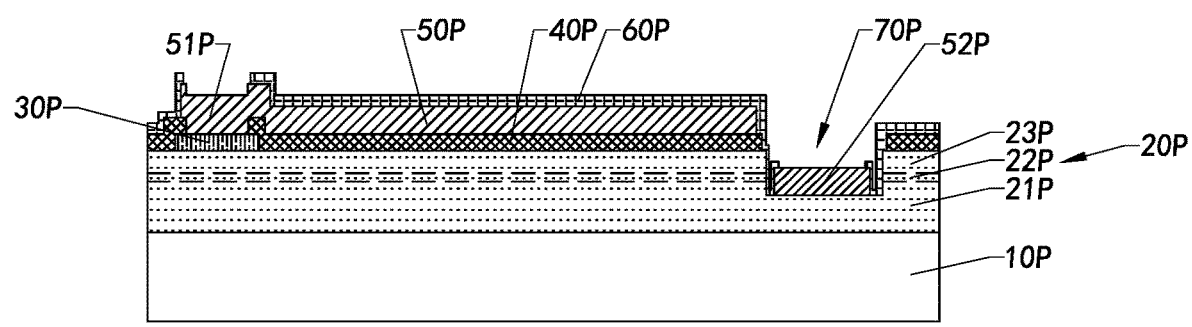
FIG. 7A is a schematic view of a step six of the manufacturing process of the conventional LED chip, illustrating a cross-section view of forming a passivation protective layer on the P-type electrode and the N-type electrode.
Figure 7B:
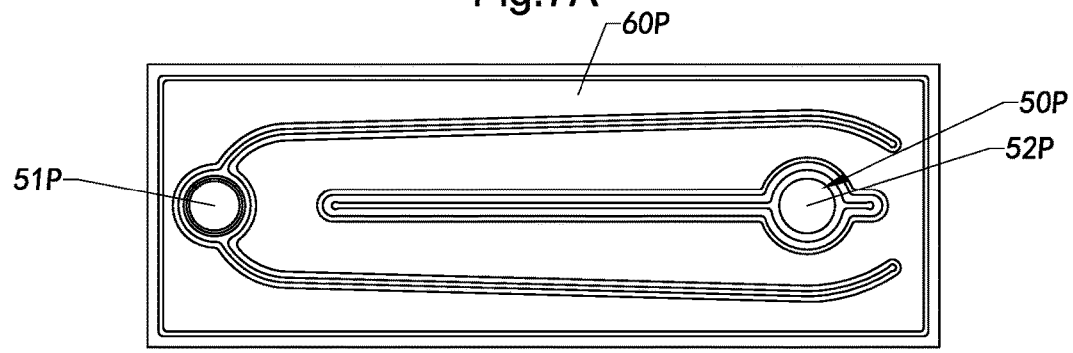
FIG. 7B is a schematic view of the step six of the manufacturing process of the conventional LED chip, illustrating a cross-section view of forming the passivation protective layer on the P-type electrode and the N-type electrode.

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

Referring to the FIGS. 8 to 17B of the drawings, a chip 100 of a LED according to a preferred embodiment of the present invention is illustrated, wherein the LED chip 100 comprises a substrate 10, an epitaxial stacked layer 20, a transparent electric conductive layer 30, a passivation protective layer 40, and an electrode assembly 50.

In particular, the epitaxial stacked layer 20 comprises an N-type semiconductor layer 21, an active region 22 and a P-type semiconductor layer 23, wherein the substrate 10, the N-type semiconductor layer 21, the active region 22, the P-type semiconductor layer 23, the transparent electric conductive layer 30, and the passivation protective layer 40 are stacked in sequence. The transparent electric conductive layer 30 is electrically linked with the P-type semiconductor layer 23 of the epitaxial stacked layer 20. The electrode assembly 50 comprises an N-type electrode 51 and a P-type electrode 52, wherein the N-type electrode 51 is electrically linked with the N-type semiconductor layer 21 of the epitaxial stacked layer 20, while the P-type electrode 52 is electrically linked with the transparent electric conductive layer 30. Accordingly, an external voltage is able to be applied to the N-type semiconductor layer 21 and the P-type semiconductor layer 23 from the P-type electrode 52 and the N-type electrode 51 respectively, so that an electric current passing through the active region 22 of the epitaxial stacked layer 20 is able to be compounded at the active region 22 to produce lighting. Preferably, the active region 22 is embodied as a MQW (Multiple Quantum Well) layer and at least one of the N-type semiconductor layer 21 and the P-type semiconductor layer 23 is embodied as a gallium carbide layer.

According to the preferred embodiment of the present invention, the N-type electrode 51 and the P-type electrode 52 of the electrode assembly 50 are located at the same side of the LED chip 100. In other words, the external voltage can be applied to the N-type semiconductor layer 21 and the P-type semiconductor layer 23 by the N-type electrode 51 and the P-type electrode 52 at the same side of the LED chip 100, such that the electric current is compounded at the active region 22 to produce the light. In particular, the LED chip 100 has an N-type exposed portion 60 extending from the passivation protective layer 40 to the N-type semiconductor layer 21 through the transparent electric conductive layer 30, the P-type semiconductor layer 23 and the active region 22, in such a manner that a portion of the N-type semiconductor layer 21 is exposed at the N-type exposed portion 60. The N-type electrode 51 is retained on the N-type exposed portion 60 and is electrically linked with the N-type semiconductor layer 21.

Figure 16A:
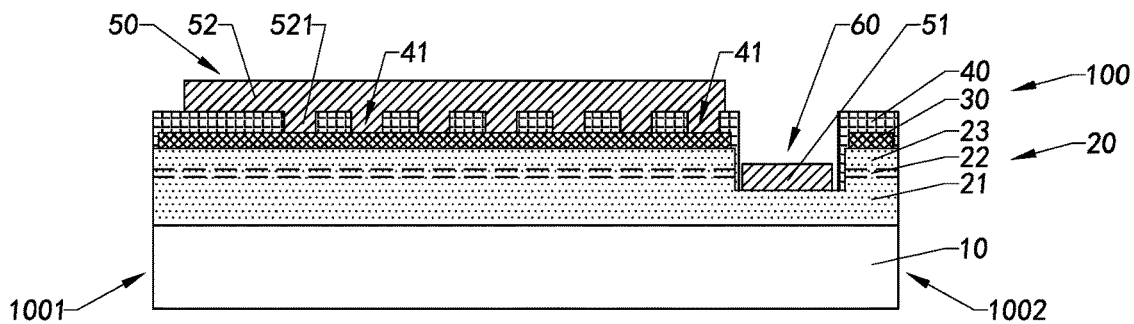
FIG. 16A is a schematic view of a step nine of the manufacturing method of the LED chip according to the above preferred embodiment of the present invention, illustrating a cross-section view of forming a P-type electrode and an N-type electrode on the passivation protective layer and the epitaxial stacked layer respectively.
Figure 16B:
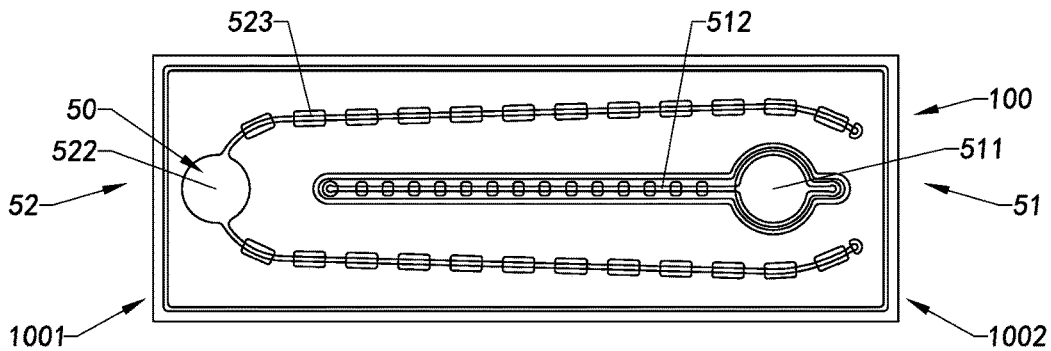
FIG. 16B is a schematic view of the step nine of the manufacturing method of the LED chip according to the above preferred embodiment of the present invention, illustrating a cross-section view of forming the P-type electrode and the N-type electrode on the passivation protective layer and the epitaxial stacked layer respectively.

Referring to the FIG. 16A and FIG. 16B of the drawings, the passivation protective layer 40 has a plurality of passive-layer holes 41 distributed in an array shape, wherein the passive-layer holes 41 of the passivation protective layer 40 are arranged corresponding to different positions of the transparent electric conductive layer 30 respectively. Correspondingly, when the P-type electrode 52 is formed at the passivation protective layer 40, the P-type electrode 52 of the electrode assembly 50 has a plurality of finger members 521 formed in the plurality of passive-layer holes 41 of the passivation protective layer 40 respectively. In other words, the plurality of finger members 521 of the P-type electrode 52 is extended across the passivation protective layer 40 from one side to the opposing side thereof through the plurality of the passive-layer holes 41 of the passivation protective layer 40 respectively, and that the plurality of finger members 521 of the P-type electrode 52 is electrically linked with the transparent electric conductive layer 30, such that the LED chip 100 is able to produce light spots in the plurality of passive-layer holes 41 of the passivation protective layer 40, so that the brightness of the LED chip 100 is enhanced.

It is worth mentioning that the P-type electrode 52 is electrically linked with the transparent electric conductive layer 30 by the plurality of finger members 521, such that the current is guided to the transparent electric conductive layer 30 from the different positions thereof by the plurality of finger members 521 of the P-type electrode 52, when the voltage is applied to the N-type electrode 51 and the P-type electrode 52. Accordingly, the electric current distribution of the LED chip 100 is more even, which is benefit to improve a uniform illumination at different positions of the active region 22 and the luminous efficiency of the chip 100.

Figure 8:
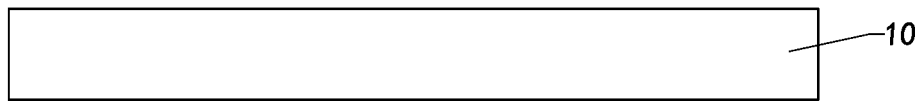
FIG. 8 is a schematic view of a step one of a manufacturing method of a LED chip according to a preferred embodiment of the present invention, illustrating a cross-section view of a substrate of the LED chip.

Referring to the FIGS. 8 to 16B of the drawings, a manufacturing process of the LED chip is illustrated. In particular, in the stage as shown in FIG. 8, the substrate 10 is provided, wherein the type of the substrate is not intended to be limiting in the present invention. For example, the substrate 10 of the LED chip 100 can include, but not limited to, a sapphire substrate, a silicon substrate, a silicon-carbide substrate, and etc.

Figure 9:
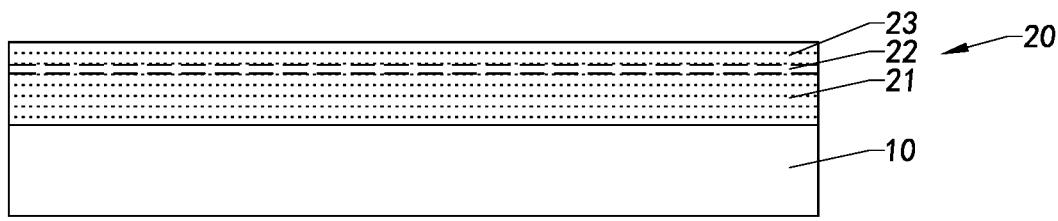
FIG. 9 is a schematic view of a step two of the manufacturing method of the LED chip according to the above preferred embodiment of the present invention, illustrating a cross-section view of stacking an epitaxial stacked layer on the substrate.

In the stage as shown in the FIG. 9 of the drawings, the N-type semiconductor layer 21, the active region 22, and the P-type semiconductor layer 23 of the epitaxial stacked layer 20 are formed on the substrate 10 in sequence, such that the substrate 10, the N-type semiconductor layer 21, the active region 22, the P-type semiconductor layer 23 of the epitaxial stacked layer 20 are stacked one after one sequentially.

It is worth mentioning that the way of generating the N-type semiconductor layer 21, the active region 22, and the P-type semiconductor layer 23 of the epitaxial stacked layer 20 on the substrate 10 sequentially is not intended to be limiting in the present invention. For example, the N-type semiconductor layer 21, the active region 22, and the P-type semiconductor layer 23 can be produced by the MOCVD (Metal-organic Chemical Vapor Deposition) technique, such that the substrate 10, the N-type semiconductor layer 21, the active region 22, the P-type semiconductor layer 23 of the epitaxial stacked layer 20 are stacked overlappedly and sequentially.

In the stage as shown in the FIGS. 10 to 12B of the drawings, the transparent electric conductive layer 30 is stacked on the P-type semiconductor layer 23 of the epitaxial stacked layer 20, and then predetermined positions of the transparent electric conductive layer 30, the P-type semiconductor layer 23 of the epitaxial stacked layer 20 the active region 22 are etched so as to form the N-type hole 101, such that the N-type semiconductor layer 21 of the epitaxial stacked layer 20 is exposed to the N-type hole 101.

It is worth mentioning that, according to the embodiment as shown in the FIGS. 10 to 12B of the drawings, only the transparent electric conductive layer 30 and the P-type semiconductor layer 23 of the epitaxial stacked layer 20 and the pre-determined position of the active region 22 are etched in order to form the N-type hole 101 for exposing the N-type semiconductor layer 21 of the epitaxial stacked layer 20. According to another preferred embodiment of the LED chip 100 of the present invention, the transparent electric conductive layer 30, the P-type semiconductor layer 23 and the active region 22 of the epitaxial stacked layer 20, and the pre-determined position of the N-type semiconductor layer 21 are completely etched, while the N-type semiconductor layer 21 are only partially etched in order to form the N-type hole 101 for exposing the N-type semiconductor layer 21 of the epitaxial stacked layer 20.

Figure 10:
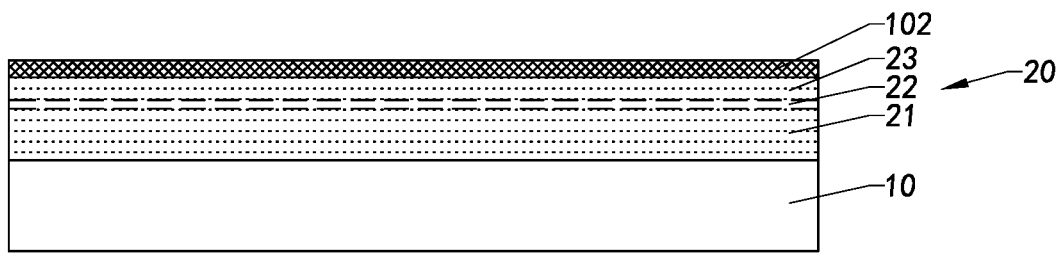
FIG. 10 is a schematic view of a step three of the manufacturing method of the LED chip according to the above preferred embodiment of the present invention, illustrating a cross-section view of stacking a transparent electric conductive layer on the epitaxial layer.
Figure 11:
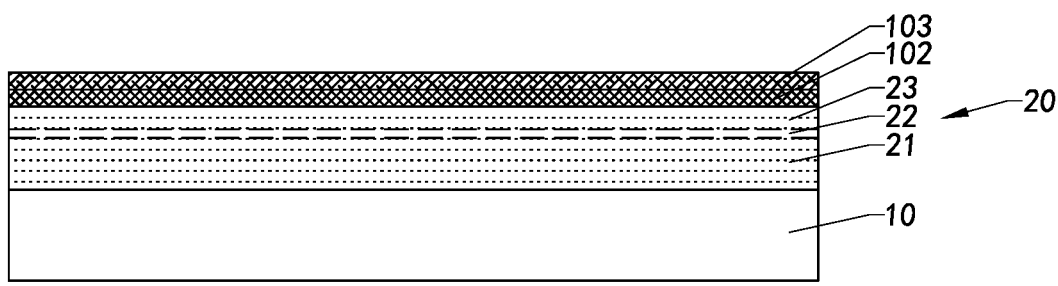
FIG. 11 is a schematic view of a step four of the manufacturing method of the LED chip according to the above preferred embodiment of the present invention, illustrating a cross-section view of stacking a first photoresist layer on the transparent electric conductive layer.
Figure 12A:
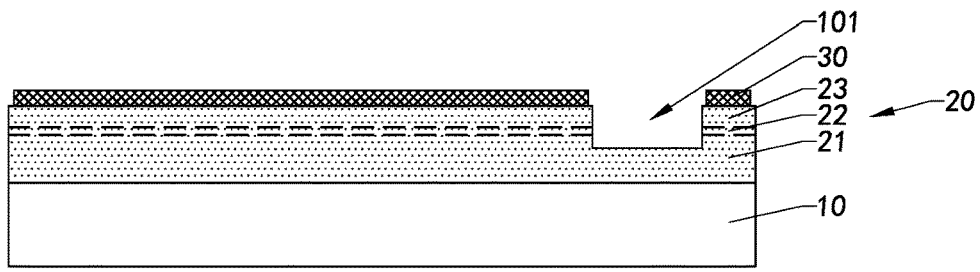
FIG. 12A is a schematic view of a step five of the manufacturing method of the LED chip according to the above preferred embodiment of the present invention, illustrating a cross-section view of forming a transparent electric conductive layer and an N-type exposed portion on the epitaxial layer stack, while the first photoresist layer is removed.
Figure 12B:
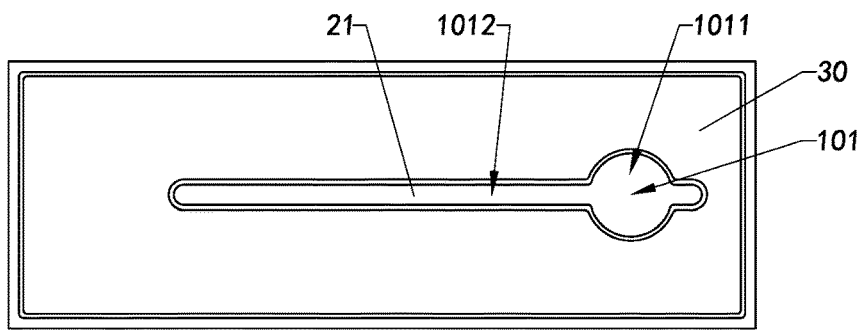
FIG. 12B is a schematic view of the step five of the manufacturing method of the LED chip according to the above preferred embodiment of the present invention, illustrating a top view of forming the transparent electric conductive layer and the N-type exposed portion on the epitaxial layer stack, while the first photoresist layer is removed.

More specifically, in the stage as shown in FIG. 10, a transparent electric conductive base layer 102 is stacked on the P-type semiconductor layer 23 of the epitaxial stacked layer 20. Then, in the stage as shown in FIG. 11, a first photoresist layer 103 is stacked on the transparent electric conductive base layer 102. Then, in the stage as shown in FIGS. 12A and 12B, the first photoresist layer 103, the transparent electric conductive base layer 102, the P-type semiconductor layer 23, the active region 22, and the N-type hole 101 are etched sequentially to expose a portion of the outer surface of the N-type semiconductor layer 21 via the N-type hole 101, while the transparent electric conductive base layer 102 is stackedly formed on the transparent electric conductive layer 30 of the P-type semiconductor layer 23. It is appreciated that that the N-type hole 101 is extended from the transparent electric conductive layer 30 to the N-type semiconductor layer 21 through the P-type semiconductor layer 23 and the active region 22 to expose a portion of the surface of the N-type semiconductor layer 21 via the N-type hole 101. The first photoresist layer 103 is removed after the N-type hole 101 is formed.

According to a preferred embodiment of the LED chip 100 of the present invention, in the stage as shown in FIG. 10, the transparent electric conductive base layer 102 is stacked on the P-type semiconductor layer 23 of the epitaxial stacked layer 20 through evaporation techniques. Certainly, person skilled in the art would understand that the way of stacking the transparent electric conductive base layer 102 on the P-type semiconductor layer 23 of the epitaxial stacked layer 20 is not limited to the evaporation technique. For example, the transparent electric conductive base layer 102 may also be stacked on the P-type semiconductor layer 23 of the epitaxial stacked layer 20 by precipitation technique.

The different between the manufacturing method of the present invention with the conventional manufacturing process is that the transparent electric conductive layer 30 is stacked on the P-type semiconductor layer 23 of the epitaxial stacked layer 20 after the epitaxial stacked layer 20 is etched to expose the N-type semiconductor layer 21, so that the photoetching process of the chip in the conventional manufacturing process can be eliminated that the transparent electric conductive base layer 102 is stacked on the P-type semiconductor layer 23 of the epitaxial stacked layer 20, and then the transparent electric conductive base layer 102, the P-type semiconductor layer 23 of the epitaxial stacked layer 20, the active region 22, and the N-type semiconductor layer 21 are etched to form the N-type hole 101 for exposing the portion of the surface of the N-type semiconductor layer 21 simultaneously. Accordingly, the production line of the LED chip 100 can be shortened so as to improve the productivity of the chip and reduce the manufacturing cost thereof.

It is worth mentioning that, as shown in the FIG. 12A, the N-type hole 101 has a boning-pad hole 1011 formed at a second end portion 1002 of the chip 100 and an extension hole 1012 is extended from the boning-pad hole 1011 to the first end portion of the LED chip 100 along a longitudinal direction of the chip 100 from a mid-portion thereof. It is appreciated that the N-type hole 101 having the extension hole 1012 as shown in the FIG. 12A is only exemplary, which is not intended to limit the scope of the chip 100 of the present invention. In other words, in other examples of the present invention, the N-type hole 101 of the chip 100 may have two or more extension holes 1012.

In the stage as shown in the FIG. 13 to FIG. 15B of the drawings, the transparent electric conductive layer 30 and the N-type semiconductor layer 21 are stacked on the passivation protective layer 40. Then, the predetermined position(s) of the passivation protective layer 40 are removed so as to form the N-type exposed portion 60 and the plurality of passive-layer holes 41 of the passivation protective layer 40. In other words, the N-type exposed portion 60 is extended from the passivation protective layer 40 to the N-type semiconductor layer 21 through the transparent electric conductive layer 30, the P-type semiconductor layer 23 and the active region 22, so as to expose a portion of the N-type semiconductor layer 21.

Figure 13:
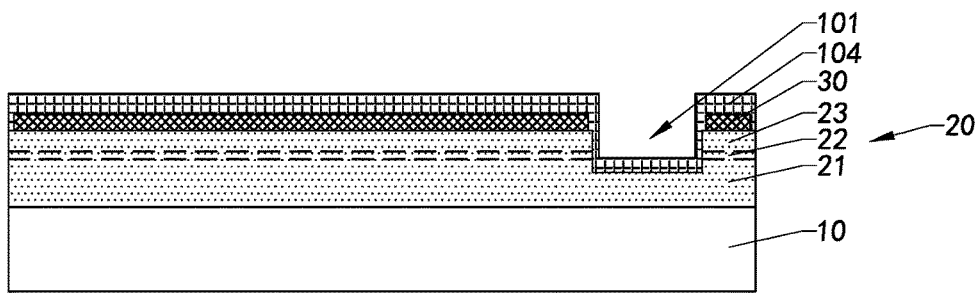
FIG. 13 is a schematic view of a step six of the manufacturing method of the LED chip according to the above preferred embodiment of the present invention, illustrating a cross-section view of stacking a passive base layer on the epitaxial stacked layer and the transparent electric conductive layer.
Figure 14:
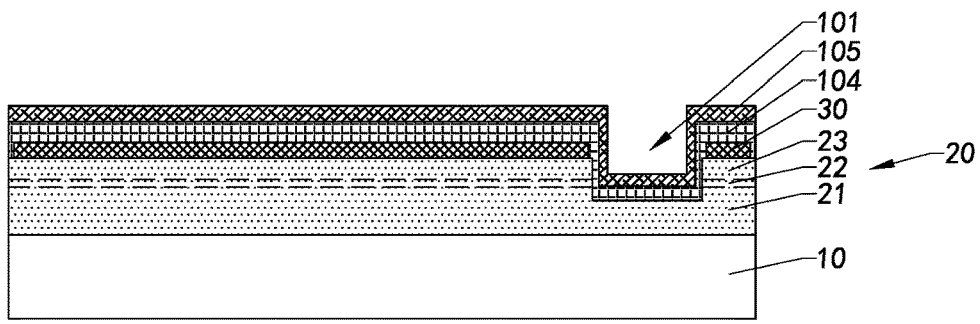
FIG. 14 is a schematic view of a step seven of the manufacturing method of the LED chip according to the above preferred embodiment of the present invention, illustrating a cross-section view of stacking a second photoresist layer on the passive base layer of the manufacturing process of the LED chip.
Figure 15A:
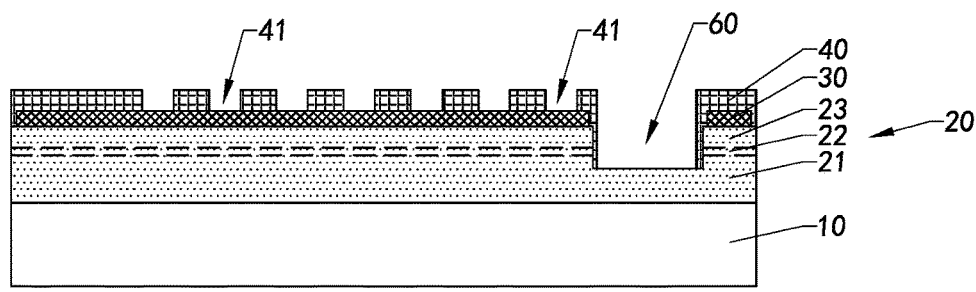
FIG. 15A is a schematic view of a step eight of the manufacturing method of the LED chip according to the above preferred embodiment of the present invention, illustrating a cross-section view of forming a passivation protective layer on the epitaxial stacked layer and the transparent electric conductive layer, while the second photoresist layer is stripped.
Figure 15B:
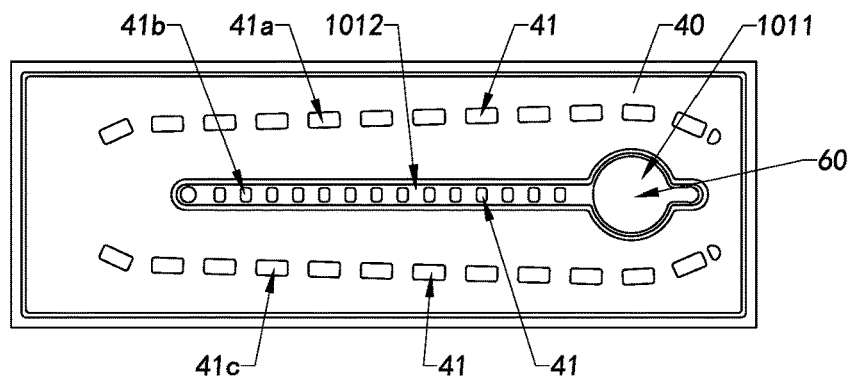
FIG. 15B is a schematic view of the step eight of the manufacturing method of the LED chip according to the above preferred embodiment of the present invention, illustrating a top view of forming the passivation protective layer on the epitaxial stacked layer and the transparent electric conductive layer, while the second photoresist layer is removed.

In particular, firstly, in the stage as shown in FIG. 13, a passive base layer 104 is stacked on the transparent electric conductive layer 30 and the N-type semiconductor layer 21. Then, in the stage as shown in FIG. 14, a second photoresist layer 105 is stacked on the passive base layer 104. Then, in the stage as shown in FIGS. 15A and 15B, the predetermined position of the passive base layer 104 is removed so as to form the passivation protective layer 40 stacked on the transparent electric conductive layer 30, the N-type exposed portion 60 for exposing the N-type semiconductor layer 21 and the plurality of passive-layer holes 41 of the passivation protective layer 40. The second photoresist layer 105 is removed after the passivation protective layer 40, the passive-layer holes 41 of the passivation protective layer 40 and the N-type exposed portion 60 are formed.

The different between the manufacturing method of the present invention with the conventional manufacturing process is that the passivation protective layer 40 is stacked on the P-type electrode 52 so as to isolate and separate the passivation protective layer 40 and the transparent electric conductive layer 30 by the passivation protective layer 40, and that the passivation protective layer 40 is stacked on the transparent electric conductive layer 30 directly. Accordingly, the passivation protective layer 40 can not only be able to block the current, but also is able to improve the transverse expanding effect of the, such that the current distribution of the LED chip 100 is more even, which is particularly critical to improve the luminous efficiency and luminous uniformity of the LED chip 100.

In addition, the passivation protective layer 40 of the chip 100 of the present invention is stacked on the transparent electric conductive layer 30 directly so as to block the current, so that there is no need to arrange another specific current blocking layer as in the prior art. Therefore, manufacturing material for the LED chip 100 can be reduced, a photoresist process for producing the current blocking is eliminated, and thus the production line of the chip can be shortened, so as to improve the productivity of the LED chip 100 and reduce the manufacture cost thereof, while the thickness and the size of the LED chip can be reduced.

More specifically, according to the preferred embodiment as shown in the 15A and 15B, there are three columns of the passive-layer holes 41 of the passivation protective layer 40 are formed. For ease of description, the three columns of the passive-layer holes 41 are defines as a first passive-layer hole column 41a, a second passive-layer hole column 41b and a third passive-layer hole column 41c, wherein each passive-layer hole 41 of first passive-layer hole column 41a and the third passive-layer hole column 41c is extended across the LED chip 100 along a peripheral edge thereof in a symmetrical manner from the first end portion 1001 and the second end portion 1002 thereof, while each passive-layer hole 41 of the second passive-layer hole column 41b is extended along the extension hole 1012 of the N-type hole 101.

In the stage as shown in the FIG. 16A and FIG. 16B, the N-type electrode 51 is formed at the N-type exposed portion 60 of the 100 so as to electrically link the N-type electrode 51 to the N-type semiconductor layer 21 of the epitaxial stacked layer 20. The P-type electrode 52 is formed at the transparent electric conductive layer 30 and the passivation protective layer 40 so as to electrically link the P-type electrode 52 to the transparent electric conductive layer 30, thereby the LED chip 100 is produced.

Referring to the FIG. 16A and FIG. 16B, the N-type electrode 51 comprises an N-type electrode pad 511 and an N-type electrode extension 512 extended from the N-type electrode pad 511, wherein the N-type electrode pad 511 is formed in the boning-pad hole 1011 of the N-type hole 101, and the N-type electrode extension 512 is formed in the extension hole 1012 of the N-type hole 101. Accordingly, the P-type electrode 52 comprises a P-type electrode pad 522 and two P-type electrode extensions 523 extended from the P-type electrode pad 522, wherein the P-type electrode pad 522 is formed at the first end portion 1001 of the chip 100, while two P-type electrode extensions 523 are extended across the LED chip 100 in a symmetrical manner from the P-type electrode pad 522 to the second end portion 1002 thereof along a peripheral edge of the LED chip 100, wherein the N-type electrode extension 512 is supported between the two P-type electrode extensions 523.

It is worth mentioning that the plurality of finger members 521 is formed in the plurality of the passive-layer holes 41 of the passivation protective layer 40 respectively, when the P-type electrode 52 is formed at the transparent electric conductive layer 30 and the passivation protective layer 40, so that the plurality of finger members 521 is extended from one side to the opposing side of the passivation protective layer 40 through the plurality of passive-layer holes 41 of the passivation protective layer 40 respectively, so as to electrically link with the different positions of the transparent electric conductive layer 30. In other words, the plurality of finger members 521 of the P-type electrode 52 is extended from the P-type electrode extension 523 to each passive-layer holes 41 of the first passive-layer hole column of the passivation protective layer 40. The plurality of finger members 521 of the P-type electrode 52 is arranged in array shape, since the plurality of passive-layer holes 41 of the passivation protective layer 40 is in array shape. Therefore, when the external voltage is applied to the N-type electrode 51 and the P-type electrode 52, the electric current passing through the plurality of finger members 521 is distributed to different positions of the transparent electric conductive layer 30. Accordingly, the current distribution of the LED chip 100 is more even, and the illumination uniformity at different positions of the active region 22 of the chip 100 and the luminous efficiency thereof can be improved. Correspondingly, the finger members 521 are also be formed in the passive-layer holes 41 respectively and extended from the passive-layer holes 412 to the passive-layer holes 41 of the second passive-layer hole column 41b of the passivation protective layer 40.

Figure 17A:
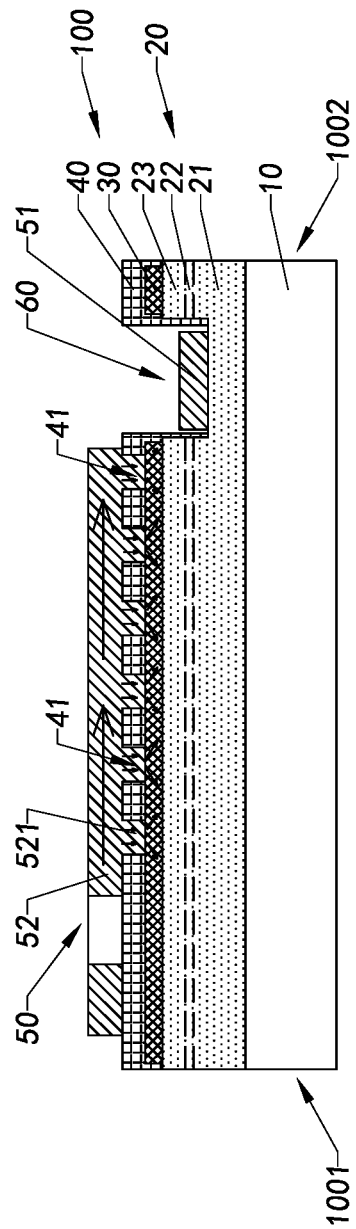
FIG. 17A is a cross-section view of a LED chip according to the above preferred embodiment of the present invention, illustrating the current trend of the LED chip.
Figure 17B:
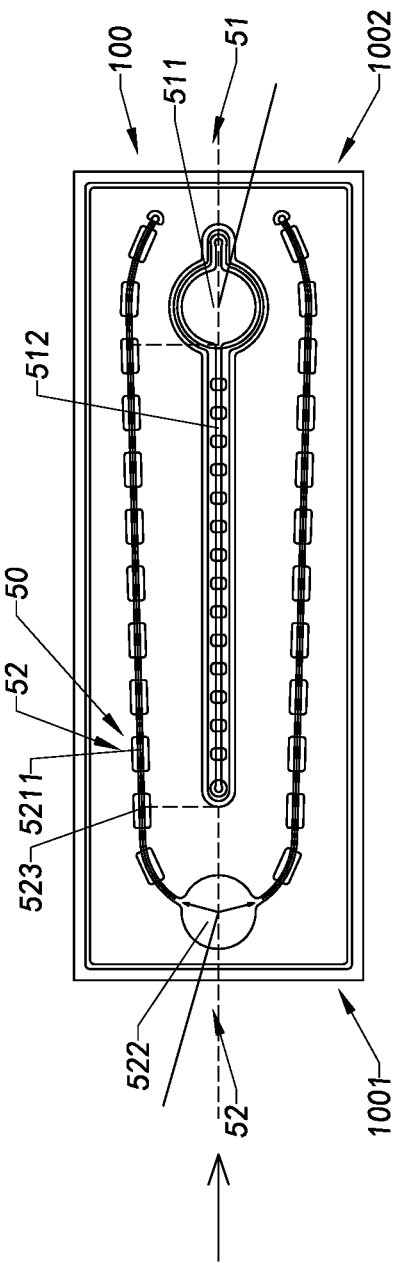
FIG. 17B is a top view of the LED chip illustrating the current flow of the LED chip according to the above preferred embodiment of the present invention.

Referring to the FIG. 17A and FIG. 17B, the current flow after the voltage being applied to the P-type electrode 52 and the N-type electrode 51 is illustrated, wherein when flowing along the P-type electrode 52 from a left side to a right side as illustrated in the FIGS. 17A and 17B, the current also flows along the plurality of finger members 521 of the P-type electrode 52 from a top side to a bottom side as illustrated in the FIG. 17A and to the transparent electric conductive layer 30. Since the plurality of finger members 521 of the P-type electrode 52 is arranged in array shape, the current flows to the transparent electric conductive layer 30 from different positions thereof. Therefore, the LED chip 100 is able to generate multiple lighting spots at the plurality of passive-layer holes 41 of the passivation protective layer 40 respectively so as to improve the brightness of the LED chip 100.

Figure 18A:
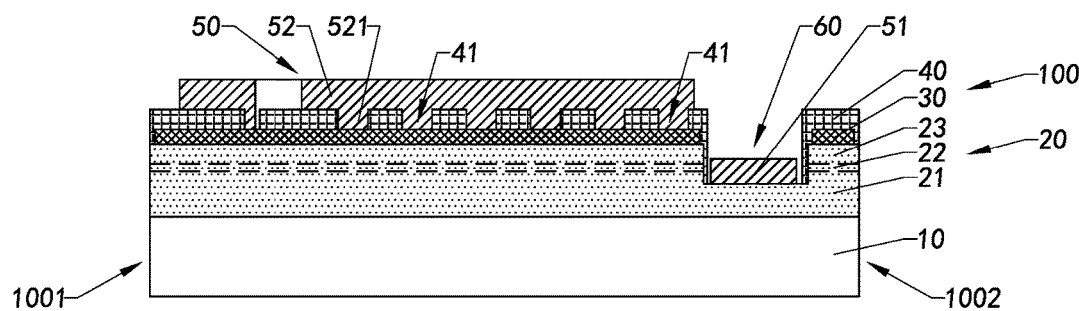
FIG. 18A is a cross-section view of a LED chip according to an alternative mode of the above preferred embodiment of the present invention.
Figure 18B:
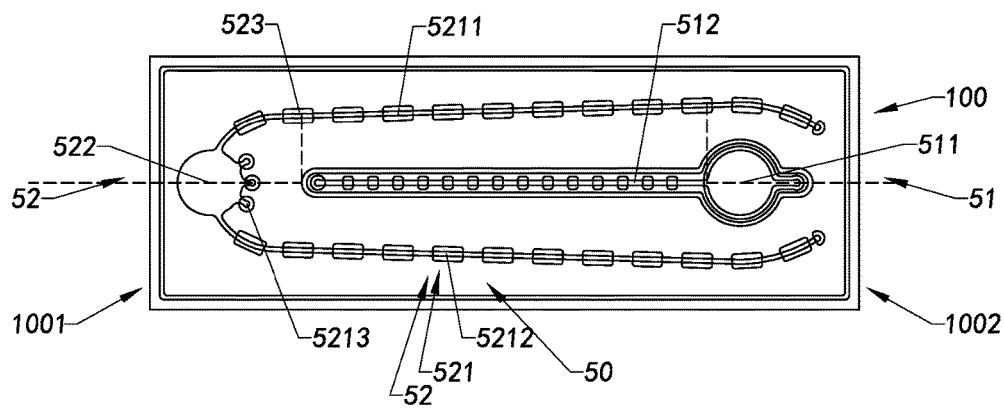
FIG. 18B is a top view of the LED chip according to an alternative mode of the above preferred embodiment of the present invention.

Referring to the FIG. 18A and FIG. 18B, an alternative mode of LED chip according to the preferred embodiment of the present invention is illustrated, wherein the plurality of passive-layer holes 41 of the passivation protective layer 40 is formed at a peripheral edge of the chip 100, which is different from the chip 100 as shown in FIG. 16A and FIG.

Figure 19A:
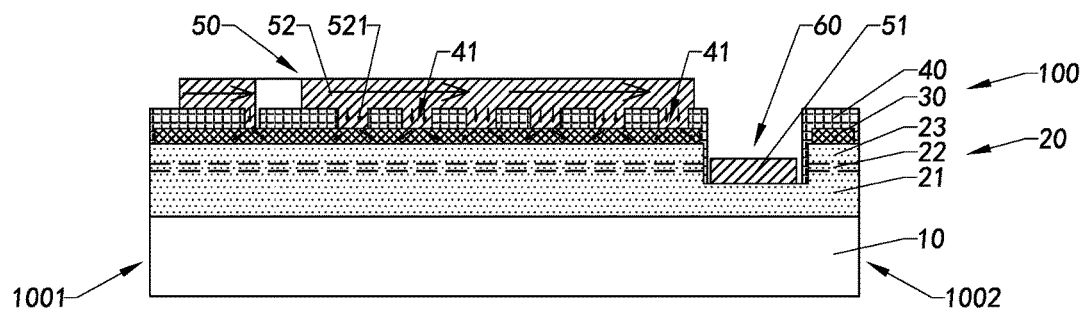
FIG. 19A is a cross-section view of a LED chip, illustrating the current flow of the LED chip, according to an alternative mode of the above preferred embodiment of the present invention.
Figure 19B:
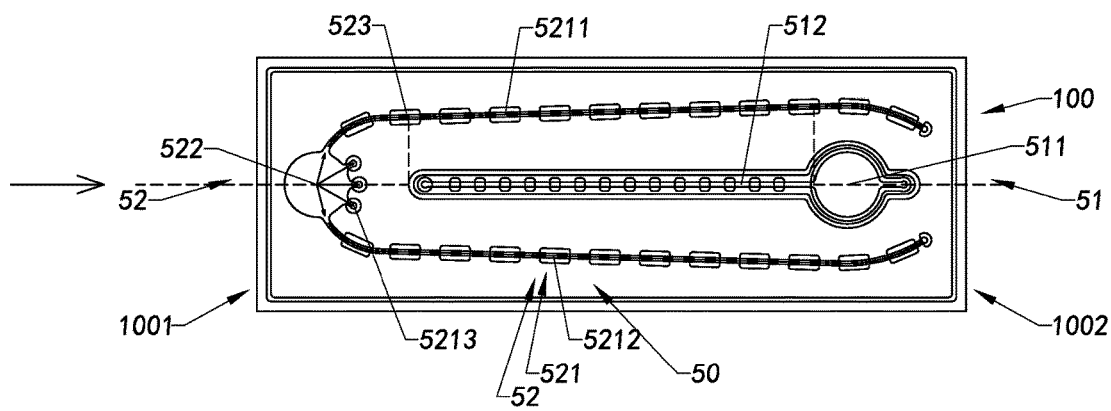
FIG. 19B is a top view of the LED chip, illustrating the current flow of the LED chip, according to an alternative mode of the above preferred embodiment of the present invention.

16B. For example, the plurality of passive-layer holes 41 of the passivation protective layer 40 is formed at a left peripheral edge as illustrated in FIG. 18A and FIG. 18B, wherein the plurality of finger members 521 is also formed at the left peripheral edge of the LED chip 100, such that the current is also guided from the top side to the bottom side as illustrated in FIG. 17A, and then is guided to the transparent electric conductive layer 30 along the plurality of finger members 521 of the P-type electrode 52 when the current flows from the left side to the right side as illustrated in FIG. 19A and the FIG. 19B along the P-type electrode 52 while the voltage is applied to the P-type electrode 52 and the N-type electrode 51.

More specifically, according to the preferred embodiment as illustrated in FIG. 16A and FIG. 16B, the N-type electrode 51 is extended from the first end portion 1001 of the LED chip 100 to the second end portion 1002 thereof at a center of the LED chip 100, wherein the plurality of finger members 521 of the P-type electrode 52 comprises a first group of finger members 5211 and a second group of finger members 5212, wherein the first group and second group of finger members 5212 are extended across the LED chip 100 along the peripheral edge from the first end portion 1001 to the second end portion 1002 thereof respectively. According to the preferred embodiment as shown in FIG. 18A and FIG. 18B of the drawings, the N-type electrode 51 is extended from the first end portion 1001 to the second end portion 1002 of the LED chip 100 at the center thereof, and the finger members 521 of the P-type electrode 52 form the first group of finger members 5211, the second group of finger members 5212 and a third group of finger members 5213, wherein the first group of finger member 5211 and the second group of finger members 5212 are extended from the second end portion 1002 to the first end portion 1001 of the LED chip 100 at the edge thereof respectively, wherein the third group of finger members 5213 is supported at the second end portion 1002 of the LED chip 100.

In accordance with another aspect of the invention, the present invention provides a manufacturing method of a LED chip of a LED, which comprises the steps of:

(a) forming the N-type semiconductor layer 21, the active region 22 and the P-type semiconductor layer 23 sequentially on the substrate 10;

(b) forming the transparent electric conductive layer 30 stacked on the P-type semiconductor layer 23 and forming the N-type hole 101 extended from the transparent electric conductive layer 30 to the N-type semiconductor layer 21 through the P-type semiconductor layer 23 and the active region 22 at the same time;

(c) stacking the passivation protective layer 40 having the plurality of passive-layer holes 41 on the transparent electric conductive layer 30, such that the plurality of passive-layer holes 41 of the passivation protective layer 40 are arranged corresponding to different positions of the transparent electric conductive layer 30 respectively; and (d) electrically linking the N-type electrode 51 to the N-type semiconductor layer 21, and electrically linking the P-type electrode 52 to the P-type semiconductor layer 23 through the plurality of passive-layer holes 41 of the passivation protective layer 40.

According to one embodiment of the present invention, the step (b) further comprises the steps of:

stacking the transparent electric conductive base layer 102 on the P-type semiconductor layer 23;

stacking the first photoresist layer 103 on the transparent electric conductive base layer 102; and etching predetermined positions of the first photoresist layer 103, the transparent electric conductive base layer 102, the P-type semiconductor layer 23, and the active region 22 so as to form the N-type hole 101 and the transparent electric conductive layer 30 simultaneously.

According to one embodiment of the present invention, the step (b) further comprises the steps of:

stacking the transparent electric conductive base layer 102 on the P-type semiconductor layer 23;

stacking the first photoresist layer 103 on the transparent electric conductive base layer 102; and etching predetermined positions of the first photoresist layer 103, the transparent electric conductive base layer 102, the P-type semiconductor layer 23, the active region 22, and the N-type semiconductor layer 21 so as to form the N-type hole 101 and the transparent electric conductive layer 30 simultaneously.

According to one embodiment of the present invention, the transparent electric conductive layer is stacked on the P-type semiconductor layer by evaporation.

Further, according to one embodiment of the present invention, in the step (c), while stacking the passivation protective layer 40 on the transparent electric conductive layer 30, the N-type exposed portion 60, which is extended from the passivation protective layer 40 to the N-type semiconductor layer 21 through the transparent electric conductive layer 30, the P-type semiconductor layer 23 and the active region 22, is formed at the position of N-type hole 101.

According to one embodiment of the present invention, the step (c) further comprises the steps of:

stacking the passive base layer 104 on the transparent electric conductive layer 30;

stacking the second photoresist layer 105 on the passive base layer 104; and removing the second photoresist layer 105 and the passive base layer 104 at the positions corresponding to the N-type holes 101, such that the passivation protective layer 50 and the N-type exposed portion 60 are formed simultaneously.

Further, according to one embodiment of the present invention, in the step (d), the plurality of finger members 521, extending from one side to the opposing side of the passivation protective layer 40 through the plurality passive-layer holes 41 of the passivation protective layer 40 respectively, are formed when the P-type electrode 52 is formed on the passivation protective layer 50, wherein the finger members 521 are electrically linked with the transparent electric conductive layer 30 at different positions of the transparent electric conductive layer 30 respectively.

In accordance with another aspect of the invention, the present invention provides a light-emitting method of a LED chip of a LED, which comprises the steps of:

(A) applying an electric current to different positions of the transparent electric conductive layer 30, such that the electrical current is evenly distributed at the transparent electric conductive layer 30; and (B) applying a voltage at two sides of the active region 22 from the N-type semiconductor layer 21 and the P-type semiconductor layer 23, such that the active region 22 is enabled to produce lighting, wherein the transparent electric conductive layer 30 is stacked on the P-type semiconductor layer 23.

According to one embodiment of the present invention, the electric current is applied to the transparent electric conductive layer 30 from two sides of the LED chip 100, such that the electrical current is evenly distributed at the transparent electric conductive layer 30.

According to one embodiment of the present invention, the electric current is applied to the transparent electric conductive layer 30 at two sides and one end portion of the LED chip 100, such that the electrical current is evenly distributed at the transparent electric conductive layer 30.

Figure 20:
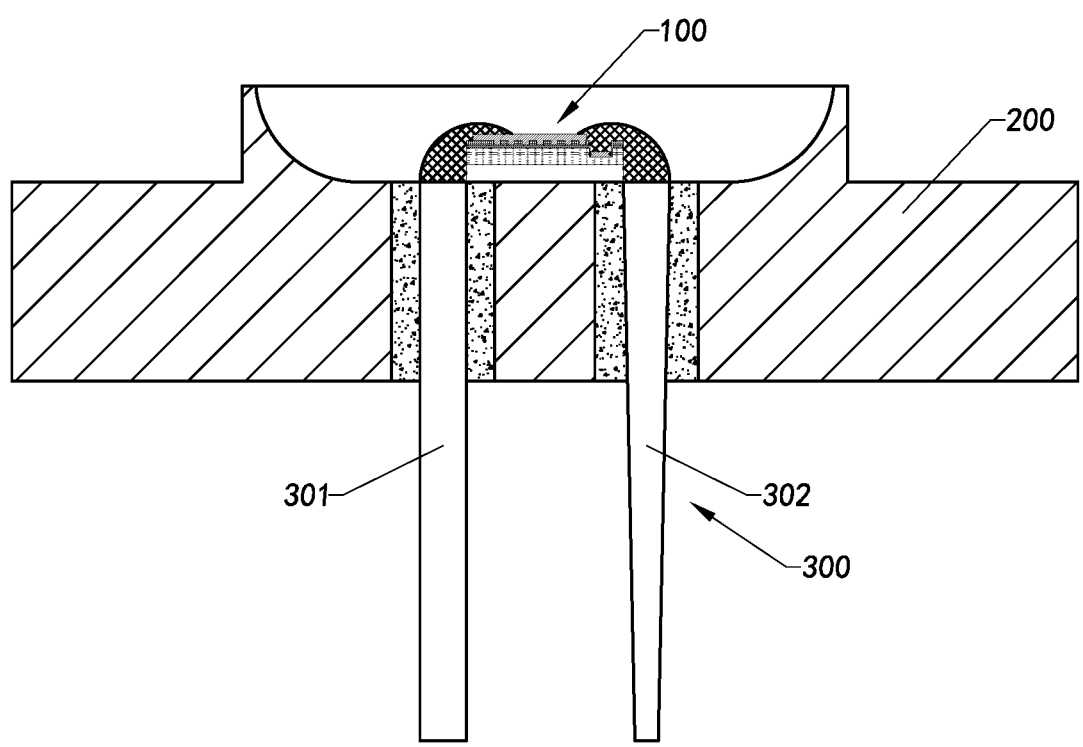
FIG. 20 is a schematic view of a LED according to a preferred embodiment of the present invention.

Referring to the FIG. 20, a LED according to a preferred embodiment of the present invention is illustrated, wherein the LED comprises at least one chip 100, an encapsulated body 200 and an electrode pin assembly 300, wherein the electrode pin assembly 300 comprises an N-type electrode pin 301 and a P-type electrode pin 302, and the at least one chip 100 is encapsulated in the package body 200. The N-type electrode pin 301 and the P-type electrode pin 302 are electrically linked with the N-type electrode 51 and the P-type electrode 52 of the chip 100 respectively, while the N-type electrode pin 301 and the P-type electrode pin 302 are extended from an interior of the package body 200 to an exterior thereof. The at least one chip 100 is able to generate light when the current flows to the active region 22 through the N-type electrode pin 301 and the P-type electrode pin 302.

Preferably, the P-type electrode pin 302 gradually reduces its size from an electrically connecting end to a free end of the P-type electrode pin 302, such that the problem of the welding portion between the P-type electrode 52 and the P-type electrode pin 302 may be burned when the pulse is aging can be avoided.

It is worth mentioning that the thickness of the substrate 10, the N-type semiconductor layer 21, the active region 22, the P-type semiconductor layer 23, the transparent electric conductive layer 30, the passivation protective layer 40, the N-type electrode 51, and the P-type electrode 52 of the LED chip 100 as shown in FIG. 8 to FIG. 20 is only exemplary, which is not intended to be limiting in the present invention. Furthermore, the real thickness of the N-type semiconductor layer 21, the active region 22, the P-type semiconductor layer 23, the transparent electric conductive layer 30, the passivation protective layer 40, the N-type electrode 51, and the P-type electrode 52 of the LED chip 100 is not the size as shown in FIGS. 8 to 20, which is also not intended to be limiting in the present invention.

One skilled in the art will understand that the embodiment of the present invention as shown in the drawings and described above is exemplary only and not intended to be limiting.

It will thus be seen that the objects of the present invention have been fully and effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A manufacturing method of a LED, comprising steps of:
   (a) forming an N-type semiconductor layer, an active region and a P-type semiconductor layer sequentially on a substrate;
   (b) forming said transparent electric conductive layer stacked on said P-type semiconductor layer and forming at least one N-type hole extended from a transparent electric conductive layer to said N-type semiconductor layer through said P-type semiconductor layer and said active region at the same time, wherein the step (b) further comprises steps of:
   stacking a transparent electric conductive base layer on said P-type semiconductor layer;
   stacking a first photoresist layer on said transparent electric conductive base layer; and
   etching at least one predetermined position of said first photoresist layer, said transparent electric conductive base layer, and said active region to form said at least one N-type hole and said transparent electric conductive layer simultaneously;
   (c) stacking a passivation protective layer having a plurality of passive-layer holes on said transparent electric conductive layer, such that said passive-layer holes of said passivation protective layer are formed corresponding to different positions of said transparent electric conductive layer respectively, wherein an N-type exposed portion, which is extended from said passivation protective layer to said N-type semiconductor layer through said transparent electric conductive layer, said P-type semiconductor layer and said active region, is formed at a position of said at least one N-type hole, while stacking said passivation protective layer on said transparent electric conductive layer, wherein the step (c) further comprises steps of:
   stacking a passive base layer on said transparent electric conductive layer;
   stacking a second photoresist layer on said passive base layer; and
   removing said second photoresist layer and said passive base layer at a position corresponding to said at least one N-type hole, such that said passivation protective layer and said N-type exposed portion are formed simultaneously; and
   (d) electrically linking an N-type electrode to said N-type semiconductor layer, and electrically linking a P-type electrode to said P-type semiconductor layer through said plurality of passive-layer holes of said passivation protective layer.

2. The method, as recited in claim 1, wherein in step (d), a plurality of finger members, extending from one side to an opposing side of said passivation protective layer through said plurality passive-layer holes of said passivation protective layer respectively, are formed when said P-type electrode is formed on said passivation protective layer, wherein said finger members are electrically linked with different positions of said transparent electric conductive layer respectively.

3. A manufacturing method of a LED, comprising steps of:
   (a) forming an N-type semiconductor layer, an active region and a P-type semiconductor layer sequentially on a substrate;
   (b) forming said transparent electric conductive layer stacked on said P-type semiconductor layer and forming at least one N-type hole extended from a transparent electric conductive layer to said N-type semiconductor layer through said P-type semiconductor layer and said active region at the same time, wherein the step (b) further comprises steps of:
   stacking a transparent electric conductive base layer on said P-type semiconductor layer;
   stacking a first photoresist layer on said transparent electric conductive base layer; and
   etching predetermined positions of said first photoresist layer, said transparent electric conductive base layer, said active region, and said N-type semiconductor layer to form said at least one N-type hole and said transparent electric conductive layer simultaneously;

(c) stacking a passivation protective layer having a plurality of passive-layer holes on said transparent electric conductive layer, such that said passive-layer holes of said passivation protective layer are formed corresponding to different positions of said transparent electric conductive layer respectively, wherein an N-type exposed portion, extending from said passivation protective layer to said N-type semiconductor layer through said transparent electric conductive layer, said P-type semiconductor layer and said active region, is formed in said at least one N-type hole, while stacking said passivation protective layer on said transparent electric conductive layer, wherein the step (c) further comprises steps of:

stacking a passive base layer on said transparent electric conductive layer;

stacking a second photoresist layer on said passive base layer; and removing said second photoresist layer and said passive base layer at a position corresponding to said at least one N-type hole, such that said passivation protective layer and said N-type exposed portion are formed simultaneously; and (d) electrically linking an N-type electrode to said N-type semiconductor layer, and electrically linking a P-type electrode to said P-type semiconductor layer through said plurality of passive-layer holes of said passivation protective layer.

4. The method, as recited in claim 3, wherein in step (d), a plurality of finger members, extending from one side to an opposing side of said passivation protective layer through said plurality passive-layer holes of said passivation protective layer respectively, are formed when said P-type electrode is formed on said passivation protective layer, wherein said finger members are electrically linked with different positions of said transparent electric conductive layer respectively.

* * * * *